US006144017A

United States Patent [19]

Millett et al.

[11] Patent Number: 6,144,017

[45] **Date of Patent: *Nov. 7, 2000**

[54] CONDENSATION CONTROL SYSTEM FOR HEATED INSULATING GLASS UNITS

[75] Inventors: Fred A. Millett, Perrysburg, Ohio; Rein S. Teder, Bloomington, Minn.; Peter F. Gerhardinger, Toledo, Ohio

[73] Assignee: Libbey-Owens-Ford Co., Toledo, Ohio

[ * ] Notice: This patent issued on a continued prosecution application filed under 37 CFR 1.53(d), and is subject to the twenty year patent term provisions of 35 U.S.C. 154(a)(2).

[21] Appl. No.: 08/820,784

[22] Filed: Mar. 19, 1997

[51] Int. Cl.[7] .......... C23C 14/34

[52] U.S. Cl. .......... 219/522; 219/203; 219/543

[58] Field of Search .......... 219/522, 203, 219/543, 219; 52/171.2, 786.1, 479, 171.3; 359/512; 312/236

[56] References Cited

U.S. PATENT DOCUMENTS

| | | | |
|---|---|---|---|
| 3,859,502 | 1/1975 | Heaney | 219/218 |
| 3,902,040 | 8/1975 | Ikeda et al. | 219/203 |
| 3,968,342 | 7/1976 | Inaba | 219/203 |
| 4,032,745 | 6/1977 | Roselli | 219/203 |
| 4,127,763 | 11/1978 | Roselli | 219/203 |
| 4,127,765 | 11/1978 | Heavey | 219/218 |
| 4,248,015 | 2/1981 | Stromquist et al. | 49/70 |
| 4,260,876 | 4/1981 | Hochheiser | 219/497 |
| 4,277,672 | 7/1981 | Jones | 219/497 |
| 4,620,141 | 10/1986 | McCumber et al. | 318/483 |
| 5,059,877 | 10/1991 | Teder | 318/444 |
| 5,213,828 | 5/1993 | Winter et al. | 428/46 |
| 5,239,244 | 8/1993 | Teder | 318/444 |
| 5,406,049 | 4/1995 | Reiser et al. | 219/219 |
| 5,414,240 | 5/1995 | Carter et al. | 219/203 |
| 5,434,384 | 7/1995 | Koontz | 214/203 |

*Primary Examiner*—Teresa Waiberg
*Assistant Examiner*—Daniel Robinson
*Attorney, Agent, or Firm*—Marshall & Melhorn

[57] ABSTRACT

A glass heating system includes a low emissivity sheet of coated glass and an optical sensor mounted on the surface of the glass for optically detecting condensation on the glass. The low emissivity glass is economical to produce and provides superior thermal properties. The low emissivity glass has improved thermal characteristics for use in insulating glass doors for freezers and refrigerators. The optical sensor is positioned between the sheets of glass in the insulating glass unit for detection of moisture on the outer surface. When condensation is detected, the controller transmits power through the conductive coating on the unexposed surface of the glass to heat the glass and eliminate the condensation. In a two paned insulating glass door, the control circuit can be conveniently mounted in the frame of the door.

9 Claims, 6 Drawing Sheets

CONDENSATION CONTROL SYSTEM FOR HEATED INSULATING GLASS UNITS

BACKGROUND OF THE INVENTION

1. Field of the Invention

The present invention pertains to a condensation control system for heated glass and heated insulating glass units, and more particularly, to a sheet of low emissivity glass with a resistive coating which is connected to a power source. An optical moisture sensor is positioned between the two sheets of glass to detect moisture on the outer surface of the glass caused by condensation. When used in an insulating glass unit for commercial freezer and refrigeration doors, the sensor controls the selective heating of the glass to prevent condensation from forming on the doors.

2. Summary of Related Art

Insulating glass units used in glass doors for commercial freezers and refrigerators are double-paned or triple-paned construction. The insulating glass units generally include a conductive coating on one of the glass surfaces for electrically heating the glass. Heating the glass keeps the doors free of frost and condensation so that customers can see the products in the freezer or refrigerator. The clear glass doors improve sales and keep the frost and condensation from damaging the goods for sale and the cooling equipment.

Because the surface temperature of a glass door is reduced below ambient temperature by the refrigerated interior, moisture tends to condense out on the surface of the glass when the temperature of the glass drops below the dewpoint of the air in the store. The object of heating the glass is to maintain the temperature of the glass above the dew point temperature of the warmer ambient air. By heating the glass above the dew point, the undesirable condensation and frost are prevented from forming on the glass of the door.

In a door consisting of a two-paned insulating glass unit, an unexposed surface of one or both of the sheets of glass is coated with a conductive material. The conductive coating is connected to an alternating current power supply by two bus bars or other electrical connectors mounted on opposite edges of the glass. As is current passes through the coating, the surface of the glass is heated to provide a condensation-free surface.

The coating in an insulating glass unit door is normally applied to the unexposed surface of the frontmost glass sheet. The frontmost sheet of glass, even though it is exposed to the ambient air, can be kept free from frost and condensation. In a humid environment when the door is opened, the innermost sheet of glass is also exposed to the ambient air and condensation may form on the exposed surface of the innermost door. Consequently, the unexposed surface of the innermost sheet of glass may also be coated to heat the innermost sheet of glass.

The current may be transferred through the coating on the glass on a continuous basis. In order to minimize the increase in cost caused by the heat from migrating to the freezer or refrigerator cabinet, the doors are generally constructed of triple pane units for freezers and double pane units for refrigeration coolers. The units are typically operated at a low heat dissipation.

Control of the power dissipated by the freezer or refrigeration door is an important concern. If the power is too low, condensation and frost will form on the glass. If the power dissipation is too high, additional costs will be incurred. The additional energy required to heat the door is a nominal cost, but the operating costs on the cooling system to maintain the freezer or refrigerator at the desired temperature can be significant. In general, the goal is to keep the units free from frost and condensation with a low power dissipation density.

Heated glass may also be used in other applications to prevent condensation, such as vending machines, bathroom mirrors, or skylights. Such units could also include a control system for selectively transmitting current across the coated surface of the glass when condensation is detected.

Sheets of glass suitable for heated applications are provided with a transparent, conductive coating on one surface. Typical transparent conductive coatings include tin oxide, indium oxide, and zinc oxide. The coating on the sheet of glass has a resistance, which is typically measured in "ohms per square," which is the resistance of a square piece of glass.

Sheet resistance in ohms per square is a well known term in the art and is used in accordance with such meaning. For a square piece of coated glass having a known sheet resistance, the resistance between opposing sides of the square piece of coated glass remains constant for any size of square. The resistance can be measured by using a 4 point probe ohmmeter or other similar measuring device.

The coated glass used in the applications noted above is often rectangular in shape. The resistance between opposing sides of the rectangular piece of coated glass varies depending on the dimensions of the glass. However, once the sheet resistance in ohms per square of a specific type of coated sheet of glass is known, the resistance between opposite sides of any rectangular piece of glass can be calculated based on the actual dimensions of the rectangular sheet of glass per the following equation:

$$R_G=(d/w)R_S$$

where $R_G$ is the resistance of the rectangular piece of coated glass as measured between the opposing sides on which the bus bars are mounted, d is the distance between the two sides with bus bars, w is the length of the two sides on which the bus bars are mounted, and $R_S$ is the surface resistance in ohms per square of a square piece of the coated glass. The ratio of d/w is often referred to as the aspect ratio.

Assuming that the coating is applied in a uniform thickness, the resistance will be uniform across the coated glass. The resistance of the coated glass can also be changed by varying the thickness of the coating applied on the glass. For coated glass connected directly to a power supply, the power dissipation may be controlled by varying the resistance of the coated glass.

A common size for a freezer door is 6 feet by 2 feet. For such a freezer door with a coating having a resistance of 100 ohms per square, the resistance of the freezer door would be 300 ohms measured between the 2-foot sides and 33.33 ohms measured between the 6-foot sides.

When current is continuously applied to the coating on the glass freezer door, the preferred power dissipation density for a freezer door in a humid environment typically ranges from 4–10 watts per square foot. The power dissipation density is reduced for less humid applications, such that the preferred range, in general, is from 1 to 10 watts per square foot. Power dissipation densities above 10 watts per square foot will not generally place undue thermal stress on the coated glass, but will result in inefficient operation of the overall cooling system. For a 2×6 freezer door with a desired power dissipation of 6 watts per square foot to heat the door, the total power dissipation for the door is 72 watts. The power dissipated by the door can be controlled by setting the voltage, current, and/or resistance in the system used to heat the door ($power=VI=V^2/R=I^2R_G$).

For a 2×6 door with bus bars directly connected to 115 volt power with dissipation density of 6 watts per square foot and power dissipation of 72 watts, the resistance of the coating on the glass door needs to be 183.7 ohms. The coating in ohms per square to achieve the desired resistance depends on which side the bus bars are positioned. If the bus bars are positioned along the short sides, the required ohms per square should be 61.2. If the bus bars are positioned on the long sides of the door, the ohms per square of the coating should be 551. The required coating varies depending on the size of the door and the positioning of the bus bars.

In the production of freezer doors and refrigerator doors for direct connection to a power supply, it has not generally been possible to specify a single coating for the glass produced for the doors. Differences in glass door size, power dissipation requirements, line voltages, and mounting configurations necessitates a number of different coatings with different ohms per square resistances. Because doors required varying sheet resistances, the majority of the glass for the doors are coated in an off-line customized production process in order to provide the resistance matching requirement.

In an off-line production operation, conductive coatings of tin oxide have traditionally been applied to glass using a pyrolytic spray batch process in a re-heat furnace. The sheet resistance is selected to provide the proper power dissipation for the door size and line voltage. The pyrolytic process is well suited to provide the relatively high sheet resistance required for direct connection to a power line. However, such a process has a number of problems. The coating of glass with tin oxide in an off-line process results in high costs, poor uniformity, interference colors which degrade the appearance of the coated glass, and overspray to the opposite surface.

On the other hand, glass coated with tin oxide in a high volume, on-line production operation provides a lower cost and readily available product that has improved clarity, uniformity, and heat transfer properties. Glass producers with high volume production lines for low emissivity glass often use a coating process consisting of atmospheric chemical vapor deposition (ACVD) to produce architectural window glass. Such glass has low hemispheric emissions which improves the insulating properties of the glass. A low emissivity glass (also called low E glass) can also be manufactured by off-line batch spray and off-line vacuum coating. Pyrolytic low emissivity glass produced in an on-line process often includes one or two color suppression layers to suppress the unwanted color of sprayed tin oxide. In an on-line pyrolytic production process, the coating is applied while the glass is being manufactured. The coating equipment is located in the tin bath in the float glass process where the glass is formed such that the residual heat of the glass is used to facilitate the chemical reaction for the coating process.

In multi-paned insulating glass units, such as freezer doors, the glass of the insulating glass unit must be heated to eliminate condensation, but yet have good insulating properties to minimize heat transfer to the freezer cabinet. The goal is to provide a coating on the glass with a low hemispheric emissivity and with a high insulating value (R value). Uncoated glass has a hemispherical emissivity of 0.84, and freezer doors must typically be triple pane units in order to minimize heat transfer into the freezer cabinet. Depending on the thickness, glass coated in an off-line process will typically have a hemispheric emissivity of between 0.4 and 0.8 while a low emissivity coated glass can achieve an improved emissivity in the range of 0.05 to 0.45.

Emissivity is a measure of both absorption and reflectance of light at given wavelengths. It is usually represented by the formula: Emissivity=1−reflectance of the coating. The term emissivity is used to refer to emissivity values measured in the infrared range by ASTM standards. Emissivity is measured using radiometric measurements and is reported as hemispherical emissivity and normal emissivity.

A triple paned insulating glass door constructed with uncoated glass will have an insulating R value of 2.94. A triple paned door with coated glass having an hemispheric emissivity of approximately 0.45 will have an improved R value of 3.70. Using a low emissivity glass of 0.15 emissivity would improve thermal performance such that a lower cost double paned unit could be provided for freezer doors. Such a double paned unit (0.15 emissivity, 0.5 inch air space) will have an R value of 3.33. Adding argon gas between the panes increases the R value to 4.0.

The use of a single low emissivity glass produced on a high volume production line could provide freezer and refrigerator door manufacturers with significant benefits. The cost of the coated glass for use in the heated doors would be reduced significantly and the thermal performance of the glass would be improved. The use of a low emissivity glass with a standard coating for high volume production is the key to obtaining the cost savings.

However, there is a significant problem with the use of low emissivity glass for heated glass applications. The low emissivity glass has low resistance such that the continuous direct connection of the glass to a power supply will produce too great a power density. In addition, the resistance matching requirements have hampered such an application.

The control systems which rely on temperature and/or humidity sensing have not provided acceptable results. Such sensors do not directly detect condensation on the surface of the sheet of glass, and provide only an approximation of when condensation will form. Such systems do not have the sensitivity or accuracy needed for controlling the power to a coated sheet of glass in insulating glass applications. A low cost control system with acceptable performance capabilities is needed to permit the use of the low emissivity glass in insulating glass door units.

Applicants have developed an insulating glass unit with a capacitively coupled heating system for continuous operation. A capacitor is coupled between the power supply and the coating of the glass to provide the desired current reduction and power dissipation for continuous operation. A single type of low emissivity glass can be used for a variety of door sizes and power supplies by changing the capacitance in the control circuit. The details of the coated glass and the control system are disclosed in the co-pending U.S. application Ser. No. 08/779,470, which disclosure is incorporated herein by such reference.

The present invention involves a control system which utilizes an optical sensor for the direct detection of condensation instead of the indirect temperature and relative humidity method. The optical sensor provides improved detection of condensation of the surface of the glass to facilitate the intermittent application of power to the coated glass.

A variety of control systems have been developed in the prior art for heated glass applications and insulating glass units. Transformers have been used to reduce the line voltage to heated glass, as shown in U.S. Pat. No. 4,248,015 to Stromquist et al. Transformers are an unacceptable solution because they are bulky and expensive. External ballast resistors (Also shown in '015) have been used, but these are large and generate unwanted heat.

Transformers have also been used to overcome a problem which frequently occurs when using a coated glass with a fixed resistance directly connected to a power source. If the humidity at an installation might be higher than was expected when the system was designed, possibly due to seasonal variation, the power density of the doors might be insufficient to keep condensation from occurring. Because power density was set by a fixed sheet resistance of the glass, expensive boost transformers have been installed to increase the voltage in order to correct condensation problems.

Control systems have been developed using triac circuits to vary the voltage applied to a heated sheet of glass, an example of which is shown in U.S. Pat. No. 4,260,876 to Hochheiser. Hochheiser senses the difference in the surface temperature of the glass and the dew point temperature of the ambient air and uses a complex solid state switch to control the current. Complex triac phase control circuits, however, may cause loads to the power line that have high peak currents and high harmonic content. Additionally, triac circuits cause large amounts of electromagnetic interference (EMI). Triac circuits which reduce harmonic distortion and EMI have been taught, for example, by Callahan et al. in U.S. Pat. No. 5,319,301. Such triac circuits, however, are complex, expensive, and of only limited effectiveness in reducing peak currents.

Reiser et al. (U.S. Pat. No. 5,347,106) discloses a control system for heating a mirror to prevent condensation formation. The coating is split into separate conductive elements with one or more scribe lines in order to control the length of the conductive path. Heaney, in U.S. Pat. No. 4,127,765, teaches that several doors may be wired in series.

Heaney also discloses the use of sensors to detect the ambient temperature, the dew point, and the relative humidity for controlling power to the coated glass. In an earlier patent (U.S. Pat. No. 3,859,502), Heaney disclosed a relative humidity sensor and a controller for controlling power to the glass based on the level of relative humidity. Humidity is sensed based on variable impedance of resistive component or electrode. Sensors for detecting relative humidity and/or temperature are disclosed in U.S. Pat. Nos. 4,277,672; 4,350,978; and 4,827,729. Temperature sensors alone, where the glass is maintained at a specified temperature, do not provide accurate control since the dew point is dependent upon both temperature and humidity. The systems with both temperature and humidity sensors have not provided the accuracy or the response time needed to efficiently operate the insulating glass units with heated glass.

Technology has been developed in the automotive industry for sensing moisture on a windshield to control the automatic operation of the windshield wipers. Wiper control systems have employed a number of different technologies to sense the moisture conditions encountered by a vehicle, including conductive (detecting variable impedance), capacitive, piezoelectric, and optical sensors. Optical sensors operate upon the principle that a light beam being diffused or deflected from its normal path by the presence of moisture on the exterior surface of the windshield. The systems which employ optical sensors have the singular advantage that the means of sensing (i.e. disturbances in an optical path) is directly related to the phenomena observed (i.e., disturbances in the optical path that effects the vision, which in this case is condensation observed by the person at the door of the freezer). Thus, optical systems generally have an advantage over other sensor technologies in that they are closely related to the problem corrected by the wipers in a windshield or by the heating of the glass in an insulating glass door unit.

McCumber et al. (U.S. Pat. No. 4,620,141) disclose an automatic control circuit for triggering a sweep of the wiper blades in response to the presence of water droplets on the exterior surface of a windshield. The rain sensor devices for controlling the windshield wipers of a vehicle as disclosed by McCumber et al. and Teder (U.S. Pat. Nos. 5,059,877 and 5,239,244) include a box-like housing mounted upon the interior surface of the windshield. The presence of moisture on the surface of the windshield changes the reflection of light at the air-glass interface, and this change in reflected light is electronically processed and utilized as the signal for activating the windshield wipers.

In the present invention, optical sensors can provide improved detection and control for eliminating condensation and facilitating the use of the low emissivity glass. The sensor housing in an optical moisture sensor should securely engage the glass and be optically coupled to the glass so as to effectively eliminate the interface between the light emitters-detectors and glass surface from an optical standpoint. In optical moisture sensors, light from an emitter is directed by a guide means into the glass at an angle of approximately forty-five degrees with respect to the glass. The light is then reflected by the outer surface of the glass at approximately a forty-five degree angle and is directed by a guide means into a detector. Water or other condensation on the surface of the glass effects the overall transmittance of the optical path between emitter and detector.

When the angle of entry of the light beam into the glass is greater than fifty degrees, a loss of signal frequently occurs. When the angle of entry is less than forty degrees, a loss of sensitivity occurs and the sensor is not able to properly detect moisture on the glass. Consequently, it is essential that the angle of entry of the light beam from the emitter enter the glass at approximately forty-five degrees.

Examples of optical sensor mounting configurations to achieve the forty-five degree angle between the optical axis of the emitter and the glass windshield are disclosed in Noack (U.S. Pat. No. 4,355,271), Bendicks (U.S. Pat. No. 5,323,637), Larson (U.S. Pat. No. 4,859,867), and Stanton (U.S. Pat. No. 5,414,257). Teder, one of the present applicants, has a co-pending application (U.S. Ser. No. 08/653,546, incorporated herein by reference) which discusses the configuration of an optical sensor in further detail.

In addition to the mounting of the optical moisture sensors on the glass, various control circuits have been developed in the windshield wiper application for processing signals from an optical moisture sensor and generating a control signal. Teder (U.S. Pat. No. 5,059,877) involves a control circuit for a windshield wiper system which is designed to drive the wiper blades at a rate dependent on the level of precipitation encountered but which also addresses the problem of noise associated with shifts in ambient light level.

Several automotive glass applications use less expensive conductive sensors instead of optical sensors. The conductive sensors are formed on the sheet of glass to measure the moisture on the surface of the glass and are based on the principle that moisture located on the surface between two electrodes will vary the impedance between the two electrodes. U.S. Pat. Nos. 3,902,040; 4,032,745; and 4,127,763 describe electrical systems used in the automotive glass industry for heaters. U.S. Pat. No. 3,968,3342 describes a coated automotive glass with a pair of electrodes attached to the surface of the glass sheet. Current through the coated glass is turned on and off in response to the variations in electrode resistance caused by condensation. The electrodes are mounted on the outer surface of the sheet of glass such that the electrodes frequently corrode or deteriorate in use, which adversely effects the accuracy of the control system.

In summary, the cost, complexity, and other problems associated with sensors and power conversion circuits have prevented manufacturers from achieving the cost benefits of using a standard low emissivity glass in heated insulating glass for freezer doors and other applications. Optical sensors provide an accurate system for moisture detection, but such optical sensors have not been used in conjunction with low emissivity coating of glass in an insulating glass unit.

SUMMARY OF THE INVENTION

In accordance with the present invention, there is provided a glass heating system for use on insulating glass units which includes a low emissivity coated glass sheet, at least one moisture sensor mounted on the coated sheet of glass, and a control system connected to the moisture sensor for controlling power to the coated glass. The low emissivity glass is economical to produce and provides superior thermal properties. However, the low emissivity glass has a low sheet resistance such that the direct connection of the coated glass to a standard 115 volt power supply would generate too much heat for most insulating glass applications, such as freezer doors. The sensor detects condensation on the surface of the glass to selectively supply power to the coated glass for eliminating the condensation.

The control circuitry provides a switch for connecting and disconnecting the power to the coated surface of the glass based on the signal from the sensor. Multiple sensors may be used on a single sheet of glass. A microprocessor may be added to the control circuitry to provide for timing circuit and variable power control. When condensation is detected by a sensor in the microprocessor controller, a high level of current may be provided to the coated glass to provide a surge of power to immediately clear the window. The power is then reduced to a lower level to maintain the glass at a raised temperature for a specified period of time. When both the innermost sheet of glass and the outermost sheet of glass are provided with a conductive coating, sensors are positioned on both sheets of glass.

The moisture sensor is mounted directly on the sheet of glass. The preferred sensor is an optical moisture sensor, which can be mounted between the two sheets of glass in an insulating glass unit. The sensor detects the presence of condensation on the outer surface of the glass and generates a signal for controlling the transmittal of power to the coated surface.

Power is delivered to the coated surface of the glass sheet only when moisture is detected on the surface of the glass by the sensor. Low emissivity glass, with its low resistance, may be used because the power is selectively supplied to the sheet of glass when condensation is detected. The excessive power which would be generated by a continuous power supply to the low emissivity coating on the glass is avoided by the use of the sensor and control for selectively supplying power.

The low emissivity glass has improved thermal characteristics, which improves the efficiency of a freezer or refrigeration insulating glass unit with heated glass system. The improved thermal characteristics permits the use of double paned doors instead of triple paned doors in many applications for insulating glass units.

In a two paned insulating glass unit for a freezer door, the innermost sheet of glass has an exposed surface facing the interior of the freezer cabinet and an unexposed surface. The outermost sheet of glass has an exposed surface facing the ambient conditions and unexposed surface face-to-face with the other unexposed surface. The unexposed surface of the outermost sheet will be coated. The unexposed surface of the innermost sheet of glass may also be coated to prevent condensation from forming on the innermost sheet when the door is opened.

The circuit board for the control circuit can be mounted in the enclosure for the sensors or can be mounted on a circuit board in the frame of the insulating glass unit. The spacing between the two sheets of glass is three-quarters or one inch, which provides sufficient space for mounting the optical sensors between the sheets of glass. Mounting the sensors within the enclosed space between the two sheets provides a clean environment and protects the sensors from damage.

An object of the present invention is to use low emissivity glass for an insulating glass unit. Such glass has low resistance and good thermal properties for the insulating glass applications. The low emissivity glass can be produced on a production line for relatively low cost.

An further object of the present invention is to develop a low cost control circuit to provide the desired power dissipation for the heated glass. A direct connection of the coated surface of the glass to a power supply produces too much power dissipation. A control system is provided with optical sensors mounted on the coated sheets of glass for optically detecting condensation. The power can be turned off until condensation is detected. When condensation is detected, the power is turned on to heat the glass.

An additional object of the present invention is to provide two levels of power or variable power to the coated surfaces. When the sensors detect moisture and power is turned on, a high level of power can be provided for a short period of time to immediately clear the window. A lower level of power can be maintained for a period of time to keep the glass clear.

Another object of the present invention is to mount the sensors in the space between the two sheets of glass in an insulating glass unit. The sensors fit conveniently between the sheets of glass. Instead of having the sensors mounted externally for measuring temperature and relative humidity, the sensors are protected in the enclosed space.

The combination of the low emissivity glass and a control circuit with optical sensors mounted in the enclosed space provides a low cost and efficient heated glass unit for use on insulating glass units, such as freezer and refrigerator doors, and other heated glass applications.

BRIEF DESCRIPTION OF THE DRAWINGS

The above, as well as other advantages of the present invention, will become readily apparent to those skilled in the art from the following detailed description of a preferred embodiment when considered in the light of the accompanying drawings in which.

DESCRIPTION OF THE PREFERRED EMBODIMENT

Figure 1:
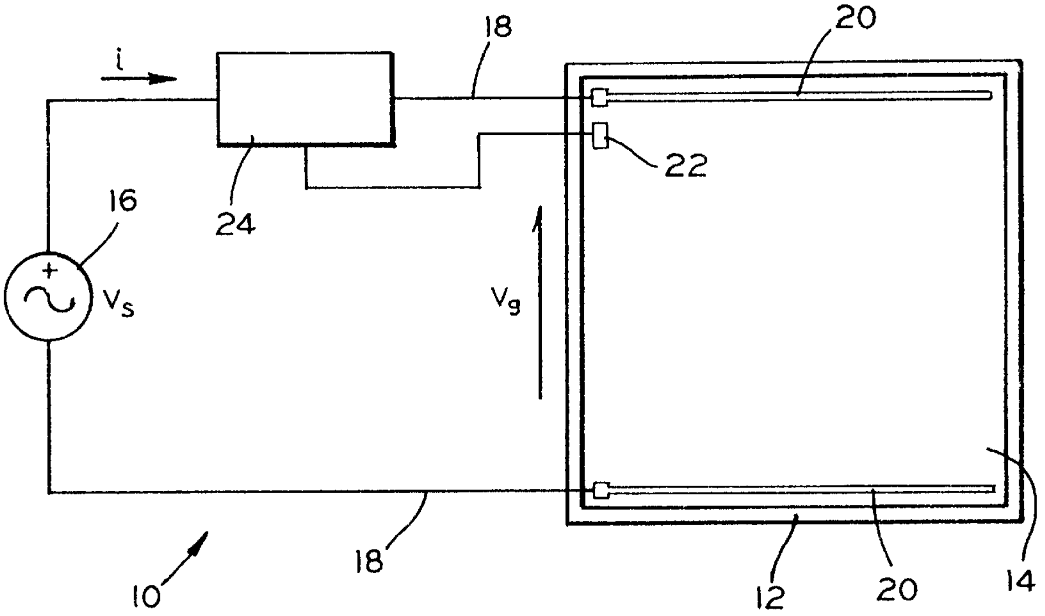
FIG. 1 is a schematic block diagram of the electrical circuit for a heated glass system of an insulating glass unit with optical moisture sensor of the present invention.

Referring now to FIG. 1, the heated glass system 10 of the present invention is shown in schematic form. A sheet of glass 12 is coated with a microscopically thin coating of a transparent, conductive material 14. The coating material 14 may be tin oxide, indium tin oxide, zinc oxide, or other similar coating. The coating may be fabricated in a production line using a pyrolytic process, such as atmospheric chemical vapor deposition, or some alternative process. The glass 12 may also include a color suppression layer (not shown) which is applied in a similar manner.

The coating 14 reduces the emissivity of the glass 12 from approximately 0.84 to less than 0.50. The preferred range for the hemispheric emissivity is 0.15 to 0.43 for pyrolytic low emissivity glass. Other processes can be used to provide a low emissivity glass with hemispheric emissivity as low 0.01. The sheet resistance of such a conductive coating for low emissivity glass is typically less than 20 ohms per square. The low emissivity glass can be produced cost effectively on a high volume production line and provides improved thermal properties.

However, the low sheet resistance prevents continuous, direct connection of the low emissivity glass 12 to the power source 16. The power source 16 is a single phase supply and in the U.S. is rated at 60 hertz and 115 volts. At a sheet resistance of 11 ohms per square, for example, a direct coupling to a 2×6 door connected for maximum resistance of 33 ohms provides 400 watts of power or 33.3 watts per square foot. Such power dissipation density is too high for freezer and refrigerator door applications.

The electric power is supplied from the power source 16 through lead 18 to the bus bars 20. The bus bars 20 are attached to the coating 14 to ensure electrical contact between the bus bars 20 and the coating 14. The bus bars 20, which are also frequently referred to as strip electrodes, are preferably positioned along opposite edges of the glass 12 such that current flows across the coating 14 between the bus bars 20 to provide for the desired power dissipation in the form of heat.

In order to reduce the power dissipation of the coating 14 on glass 12, a controller 24 is used to selectively switch the power on and off to prevent condensation from forming on the surface of the glass 12. A sensor 22 is placed on the sheet of glass to detect formation of condensation on the glass 12. The preferred sensor 22 is an optical sensor which uses light emitters and detectors to directly sense condensation on the surface of the glass 12. The optical sensor 22 is connected to a controller 24 which includes switching capabilities for connecting and disconnecting power from the power source 16 to the coated surface 14. When condensation is detected by the optical sensor 22, power is turned on. When no condensation is detected, the controller 24 disconnects the power such that power is only supplied to the coating 14 when condensation is detected on the glass 12.

Figure 2:
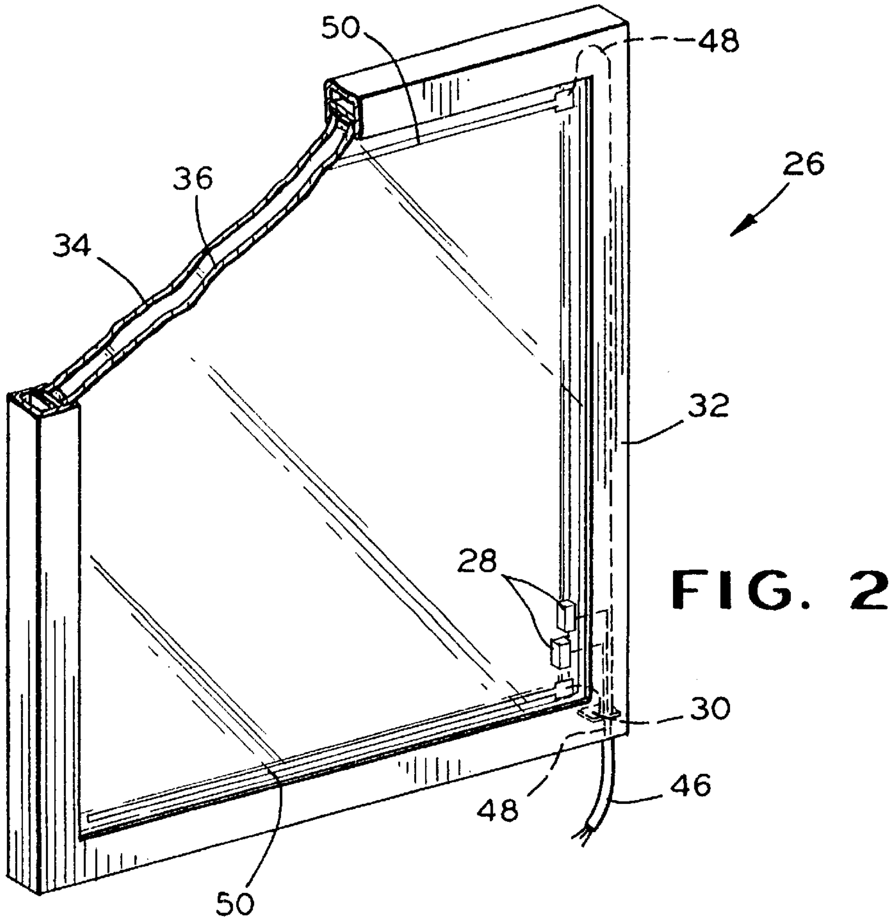
FIG. 2 is a perspective view of an insulating glass unit with a frame and two sheets of glass.
Figure 4:
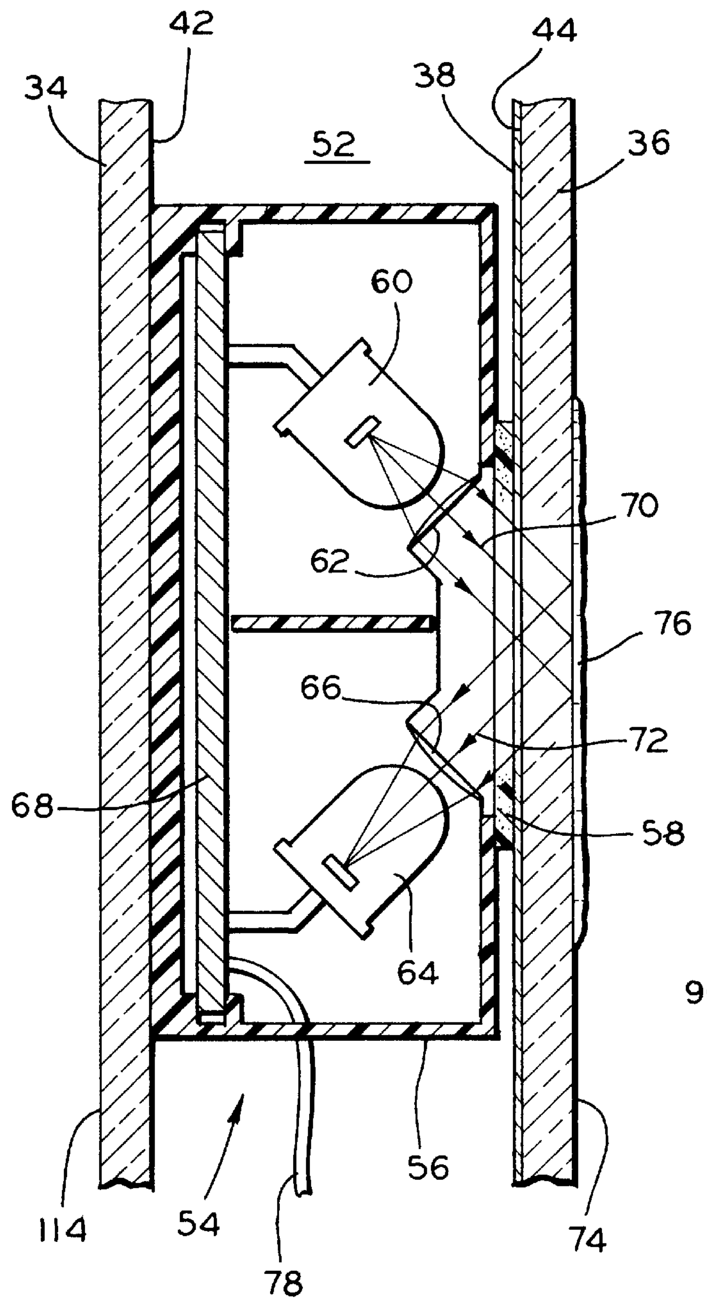
FIG. 4 is a cross sectional view of an optical sensor mounted on a sheet of glass of the insulating glass unit.
Figure 3:
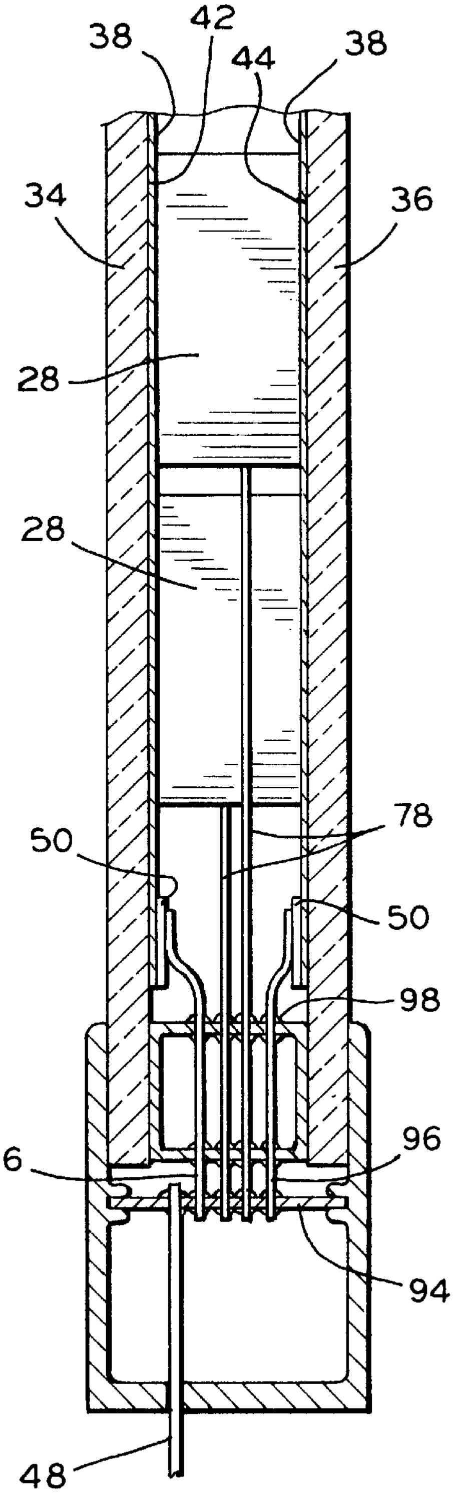
FIG. 3 is a cross sectional view of an insulating glass unit showing an optical sensor and a conductive coating on both sheets of glass.

FIGS. 2–4 show a typical freezer door formed by an insulating glass unit 26 having a heated glass system with an optical sensor 28 connected to a controller 30. The insulating glass unit 26 includes a frame 32 and two sheets of glass. The innermost piece of glass 34, which faces the freezer cabinet, may be uncoated (FIG. 4) or coated 38 (FIG. 3). If a freezer unit has a problem with condensation forming on the inner surface of the door when the door is opened, the insulating glass door unit will frequently include a coating 38 on the innermost glass 34. The outermost glass 36, which faces the user in the store, is provided with a conductive coating 38 as described above. The conductive coating 38 is preferably a low emissivity coating which can be economically produced on line. The coating 38 is applied to the unexposed surfaces 42,44 of the respective sheets of glass 34, 36. Coating the unexposed surfaces reduces any deterioration or damage to the surface when the insulating glass unit 26 is in use.

The sheets of glass 34,36 are installed in the frame 32 in a known manner for insulating glass doors. The frame 32 is made from extruded aluminum or other similar frame material. The sheets of glass 34, 36 are held apart by a spacer 40 and sealed to form an insulating glass unit 26. The space 52 between the two sheets of glass may be filled with argon gas or other transparent gases to increase the insulating value of the unit.

A grounded power cord 46 is used to convey power to the insulating glass unit 30. The two insulated leads 48 from the power cord 46 are connected to bus bars 50 at opposite ends of the glass 36. The bus bars 50 are attached to the coating 38 to ensure electrical contact between the bus bars 50 and the coating 38. The power cord 46 is connected to the insulating glass unit 30 at one end of the frame 32 in a known manner. The lead 48 electrically connected to the bus bar 50 at the opposite end of the frame 32 is secured in the frame 32 and extends along the edge of the sheets of glass 34, 36.

In FIG. 4, a more detailed drawing of a typical optical sensor 54 is shown mounted in the space 52 between the sheets of glass 34, 36. The optical sensor 54 is secured to the unexposed surface 44 of the outermost glass 36. The sensor housing 56 must securely engage the inner surface 44 of the glass 36 and be optically coupled to the glass 36 so as to effectively eliminate the interface between the light emitters-detectors and glass surface from an optical standpoint. The sensor housing 56 is affixed to the coating 38 on surface 44 by means of an adhesive interlayer 58. The double-sided adhesive interlayer 58 is made from silicone or other similar flexible plastic material.

The optical sensor 54 includes an emitter 60 with lens 62 and detector 64 with lens 66 mounted on circuit board 68. In operation, the light beam 70 is emitted from the emitter 60 and travel through the glass 36 at a forty-five degree angle. The light beam 70 is totally internally reflected off of the outer surface 74 of the glass 36 such that the reflected beam 72 is detected by the detector 64. If there is any condensation 74 or moisture of any kind on the outer surface 72, some of the light beam 70 escapes and the strength of the reflected light beam 72 is reduced. Signals to the emitter 60 and from the detector 64 are conveyed through lead 78.

Mounting the sensor 28 between the sheets of glass 34, 36 in an insulating glass unit 26 protects the sensor 28 from adverse environmental factors. The optical sensor 28 is ideally suited to detect condensation on the exposed surfaces of the glass sheets 34, 36, even though the sensor 28 is positioned in the enclosed area 52 of the insulating glass unit 26, because no exposure to the moisture or ambient conditions is required for optical measurements.

Figure 5:
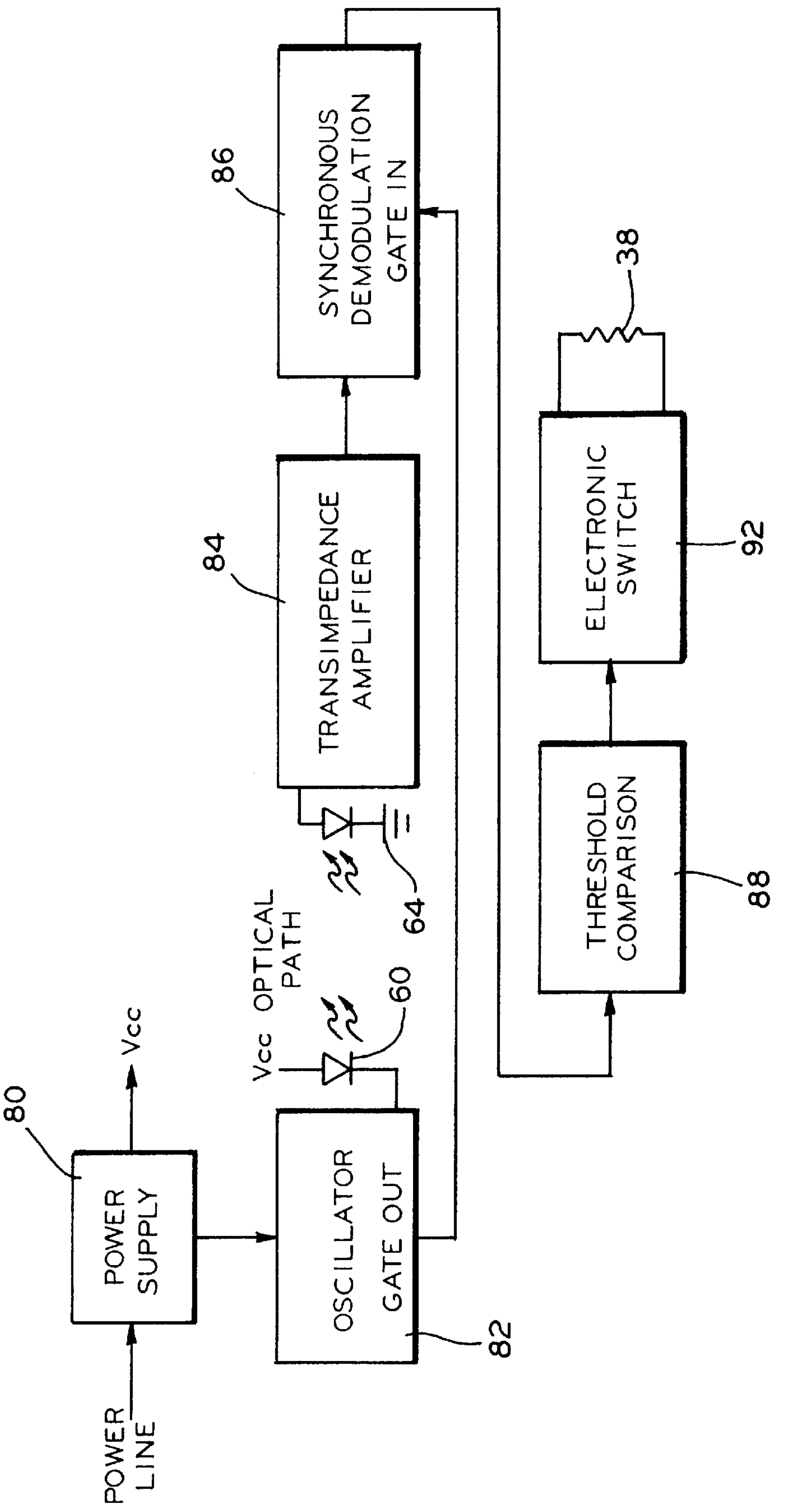
FIG. 5 is a schematic block diagram of the control circuit for the optical sensor of the heated glass system.
Figure 6:
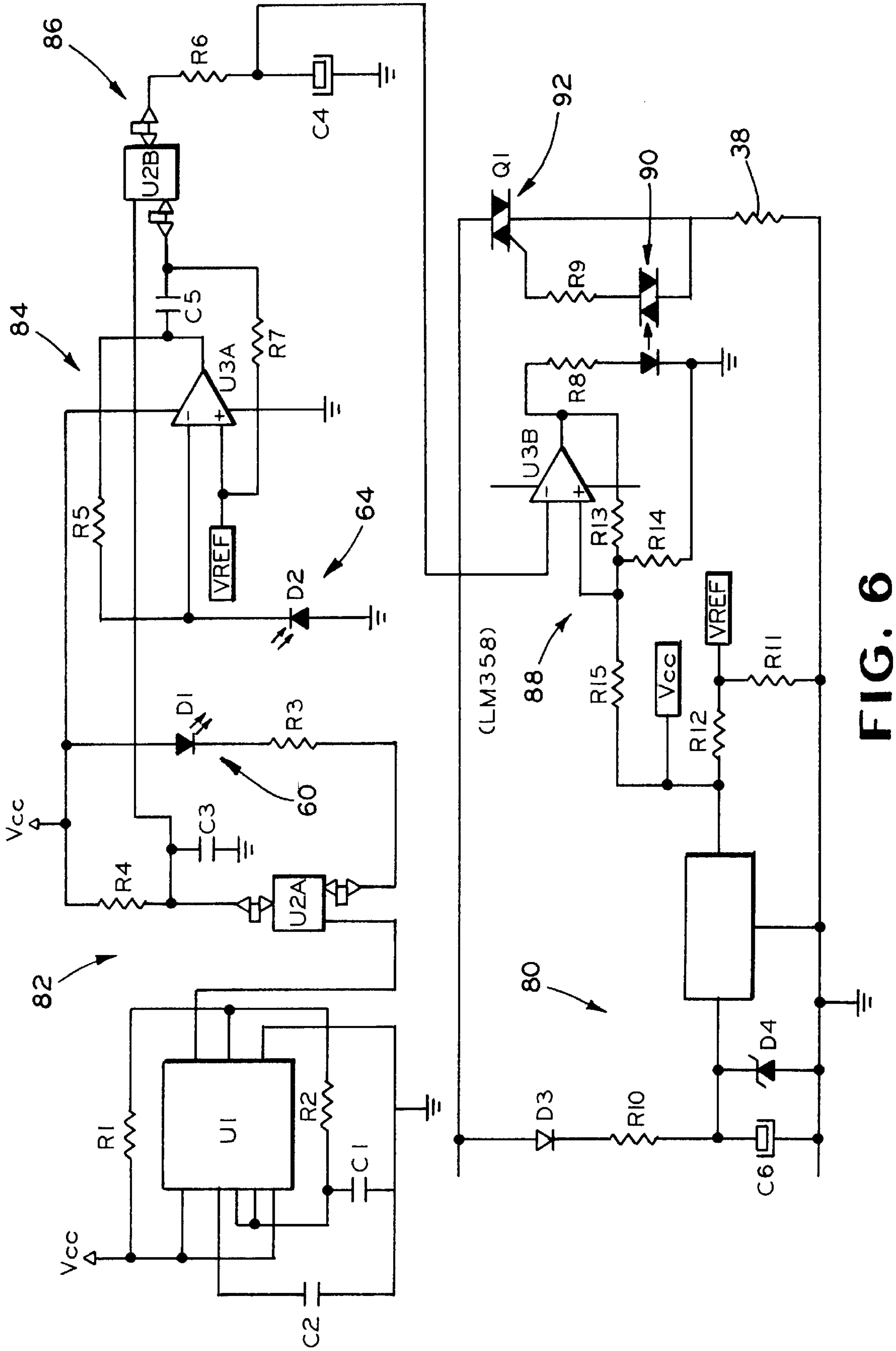
FIG. 6 is a schematic electrical diagram of the optical sensor and control circuitry.

The control circuitry for the controller 24 is shown in FIGS. 5–6. Power cord 46 and lead 48 supply power to the power supply 80 of the controller 30. An isolation transformer is not required in this application. Power is delivered to an energy storage capacitor C6 by way of a rectifier D3 and a voltage dropping resistor R18. A zener diode D4 prevents the voltage across the capacitor from exceeding 24 volts. Considerable supply ripple is present in the pre-regulated voltage, but this does not adversely effect the circuit. Three-terminal regulator S1 further regulates the voltage to provide a clean 12 V source ($V_{cc}$). Resistors R11 and R12 provide a reference voltage ($V_{ref}$), nominally 2.2 V.

The oscillator 82 (U1, R1, R2, C1, C2) is powered by $V_{cc}$ and produces a series of pulses at the output of the oscillator 82. The emitter 60 is an infrared emitter and is connected to the output of the oscillator 82 by way of a current-limiting resistor R3, which results in a series of current pulses through the emitter 60. the current in the emitter 60 causes the emitter 60 to emit a corresponding pulsatile infrared beam of light 70. The operation cycle may consist of an on-time pulse of 50 microseconds and an off-time of 10 milliseconds. This results in an average duty cycle of 0.5% and a carrier frequency of 100 hertz. The oscillator 82 includes a section U2A of a quad analog switch, a resistor R4, and a capacitor C3 to provide a delayed gate signal.

The divergence of light beam 70 is reduced by lens 62, which is used to collimate the light beam. The emitter is disposed at a forty-five degrees ingress axis with regard to the glass 36. The parallel rays of light beam 70 are optically coupled into the glass by the adhesive interlayer 58. The rays of light beam 70 are totally internally reflected off of the outer surface 74 of the glass 36. The rays of light beam 70 entering the glass 36 are reflected back as reflected light beam 72. The reflected light beam 72 is converged by the lens 66 associated with the detector 64. The rays of the reflected light beam 72 strike the photodiode of the detector 64. The detector 64 is also disposed at a forty-five degree angle and includes a daylight filter that blocks all light except for the infrared light from the emitter 60. Other optical configurations are known in the prior art and would also be suitable for the insulated glass unit 26 of the present invention. The use of optical sensors provides accurate detection of moisture on the glass surfaces. The sensors can also be mounted on the unexposed surface of the glass and remain protected in the space between the two sheets of glass.

The detector 64 produces a pulsatile current waveform in response to the pulsatile reflected beam 72 impinging on the photodiode of the detector 64. The detector 64 will include a photodiode, a phototransistor, or other optical device for producing a signal. The presence of condensation 76 or other moisture on the outer surface 74 of the glass 36 causes a reduced reflected beam 72, which results in a lower output signal. The detector 64 is connected to the inverting terminal of an operational amplifier 84 (U3A). The operational amplifier 84 is configured as a transimpedance amplifier to amplify the current from the detector 64 and to convert the current signal to a voltage signal. The output of the amplifier 84 is ac-coupled by capacitor C5 and resistor R7, which prevents coarse dc changes caused by ambient light from being passed through the circuit. The amplifier 84 is reference to $V_{ref}$.

A synchronous demodulator 86 is connected to amplifier 84 and converts the output of the amplifier 84 into a dc signal by sampling the output of the amplifier 84 during a sample interval provided by the gate signal from the oscillator 82. The slight delay of the gate signal prevents the rise-time of the of the detector current from having any effect on the signal. The sampled signal charges sampling capacitor C4 by way of resistor R. The capacitor C4 and resistor R implement a relatively long time constant, and several pulses may be necessary for capacitor C4 to become charged to a steady state level. Other signal processing circuits for detection of moisture on glass by optical sensors are known in the art. The present processing circuit is a relatively inexpensive circuit for achieving acceptable control.

The output of the synchronous demodulator 86 is connected to the inverting input to a second operational amplifier 88 (U3B). The amplifier 88 is configured to operate as a comparator. The comparator section may be half of a dual operational amplifier, such as type LM358, and the transimpedance amplifier utilizes the other half. The non-inverting input of the comparator is connected to a reference formed by resistor R15 and resistor R14, with resistor R13 forming some hysteresis. In the absence of moisture, the demodulated level (5 volts) is above the reference level (3.8 volts) and the output of the comparator amplifier 88 is low (less than 1 volt). In the presence of moisture, the demodulated level falls below the comparator level, causing the output of the comparator amplifier 88 to increase significantly (greater than 11 volts).

The output of the comparator amplifier 88 is connected to the input section of a triac opto-isolator 90. The triac opto-isolator 90 is turned on when the output voltage of the amplifier 88 is high. The triac opto-isolator 90 is connected to a power triac 92 which is configured to turn on when the triac opto-isolator 90 turns on. An opto-isolator circuit incorporating zero-crossing detection circuitry may also be substituted for the triac 90. Various switching configurations could be used to provide not only full power directed through the coating 38 to heat the glass 36, but also reduced power for extended time operation.

When no moisture is present, the opto-isolator triac 90 and the power triac 92 remain off and no current flows through the coating 38. When the power triac 92 is turned on, power is transmitted to the bus bars 50 and through the coating 38 on the glass 36. The glass 36 is heated and the condensation 76 is removed from the surface 74 of glass 36. When the condensation 76 is cleared, the power triac 92 is turned off until moisture is sensed. The hysteresis of the comparison circuit ensures that the power triac 92 will turn fully off.

Figure 7:
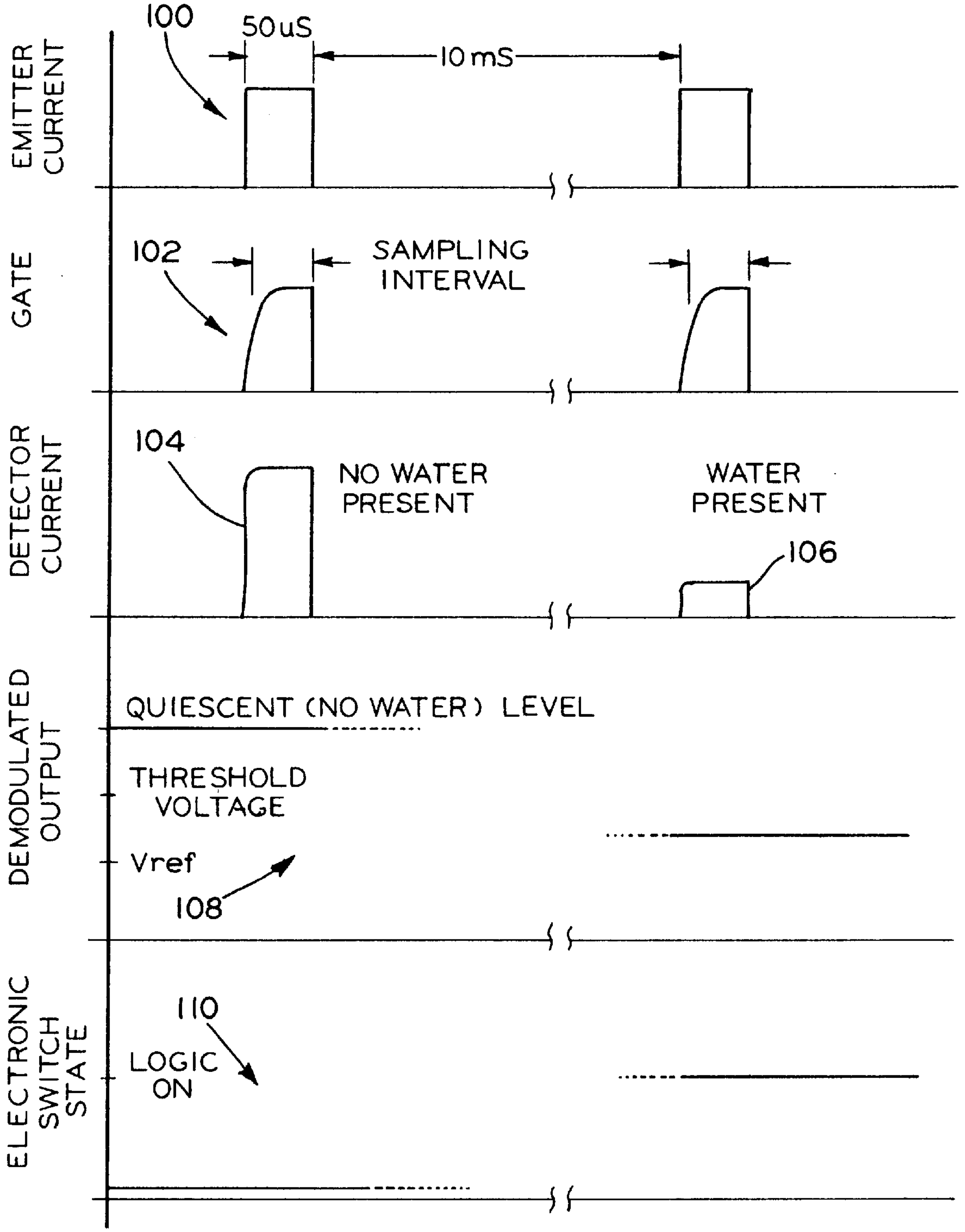
FIG. 7 is a series of wave forms showing the operation of the optical sensor.

FIG. 7 shows the operational waveforms for the above embodiment of the controller 30. The emitter current 100 and gating signal 102 are cycled at set intervals. The detector current shows the output waveform of the detector with no condensation present 104 and with condensation present 106. The corresponding waveform of the demodulated output 108 and the electronic switch state 110 are shown for no detection and detection of condensation.

The components of the controller 30 may be mounted on the circuit board 68 of the sensor 54. In the alternative, the components could be mounted on circuit board 94 secured in the frame 32. A lead 48 from the power cord 46 supplies power to the power supply 60. A short lead 96 extends from the circuit board 94 to the terminal of the bus bar 50. The circuit board 94 may be mounted at either end of the insulating glass unit 26. In addition, the emitter 60 and detector 64 could be mounted on the circuit board 94 and light pipes (conductors) could be used to couple the light beams into and out of the enclosed area. Light pipes provide the desired angles for transmission of the light from the emitter 60 to the glass and back to the detector 64. Light pipes are clear and provide less obstruction of the view than the enclosed housing 56.

In order to achieve the desired thermal insulating properties, argon or other gases may be used in the space 52 between the sheets of glass 34, 36. The gaps 98 in and about the spacer 40 are covered with a sealant to properly seal the internal space 52 within the insulating glass unit 30. If light pipes are used, the openings in the spacer 40 for the light pipes can be effectively sealed.

A number of different control circuits could be used in the controller 30. The main requirements of the circuit are to process the output from the detector 64 to control the switching of the power to the coating 38 on the glass 36. Timing circuits could be added to operate the triac switch 92 for a specified period of time after condensation is sensed. Different comparator circuits could be used to generate a signal to activate a switch. Additional examples and details of processing signals to and from the emitter and detector of an optical sensor and the operation of the control circuitry may be obtained from U.S. Pat. Nos. 4,620,141; 5,059,877; 5,239,244; and 5,262,640. To the extent any such details may be necessary to complete the descriptions and accounts necessary for purposes of the present application, they are deemed to be incorporated by reference herein.

Figure 8:
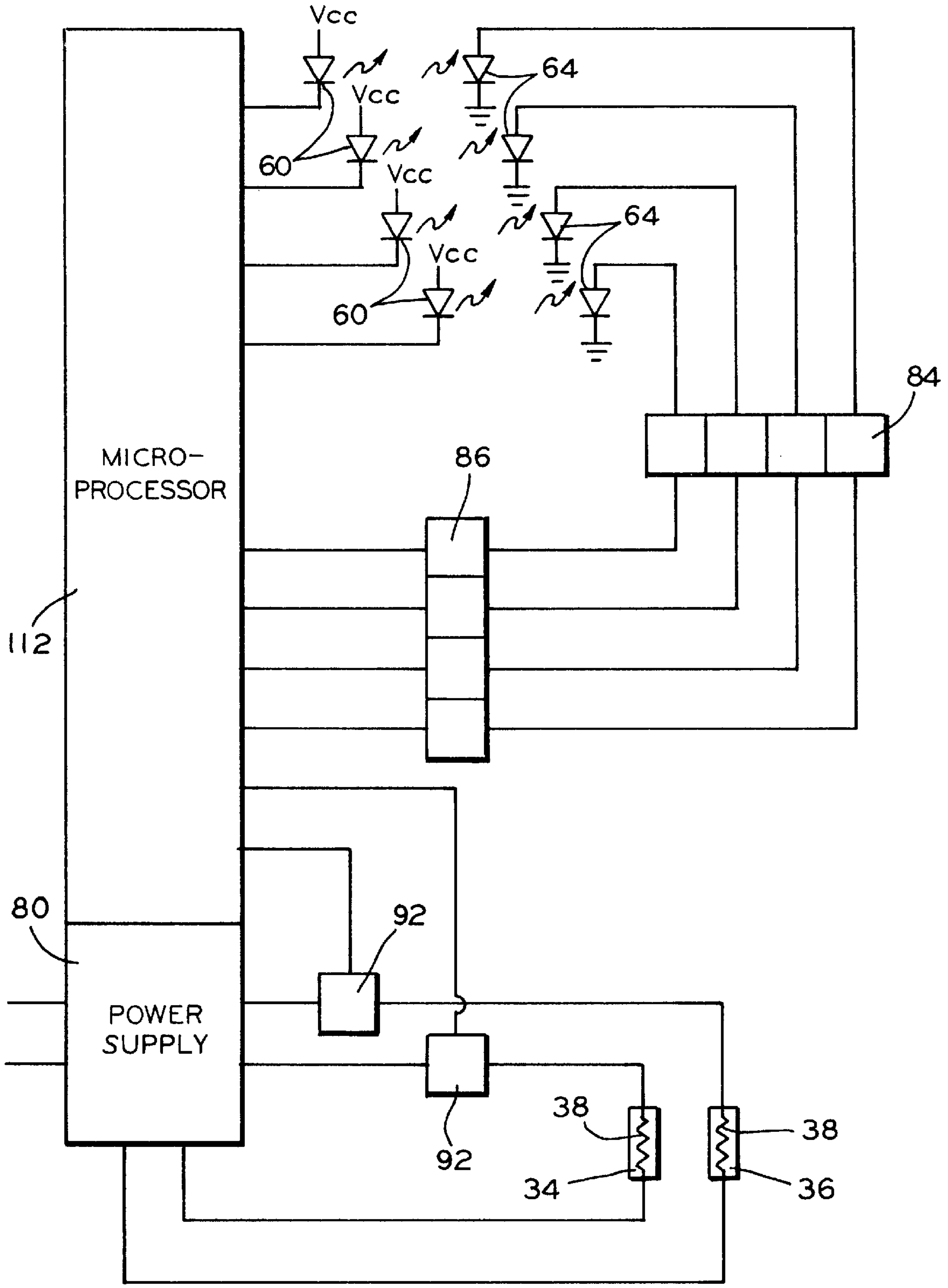
FIG. 8 is a schematic block diagram of the control circuit of an insulating glass unit with a microprocessor.

In FIG. 8, the controller 30 includes a microprocessor 112 for providing various control capabilities. The microprocessor 112 provides the functions of the oscillator and the threshold comparison circuit. The insulating glass unit 26 is provided with multiple sensors 28 and the processing of multiple signals is effectively handled by the microprocessor 112. The microprocessor 112 also detects the quiescent level, set an appropriate threshold level, and provide timing and counting circuits. Various control algorithms could be used to control the switching operations and provide more detailed operating cycles. For example, repeated on-off cycling in a short period of time may be undesirable. The microprocessor 112 counts the number of times the power is turned on during a specified period of time. If the power is switched on too frequently (three times in one minute, for example), the microprocessor detects such an occurrence and provide for power transmission to the coating 38 for an extended period of time (ten minutes).

Another control feature which could be easily incorporated into the microprocessor 112 is control of a switching device with full power and reduced power capabilities. When condensation is detected, the microprocessor provides an initial application of full power to the coating 38 to clear the condensation as quickly as possible. After full power is applied for a period of time, the microprocessor 112 controls the switching to a reduced power application for an extended period of time.

The insulating glass unit 26 may be provided with multiple sensors 28 mounted on the unexposed surface 44 of glass 36. The microprocessor 112 provides a comparator circuit to process multiple signals. Since condensation may not form evenly over the entire outer surface 74, multiple sensors 28 will typically ensure an immediate switching of the power to eliminate the condensation. When condensation 76 is detected by one of the sensors 28, the power switch 92 can be turned on to pass current through the coating 38.

The condensation 76 will form first on the exposed surface 74 of outermost glass 36, and consequently, the outermost glass 36 will be heated in an insulating glass unit 26. However, condensation 116 may also form on the exposed surface 114 of the innermost glass 34, such as when the door is opened for a period of time. The unexposed surface 42 of glass 34 can also have a conductive coating 38 applied for heating the glass 34. When both sheets of glass 34, 36 have the conductive coating 38, the power can be applied through a single switch 92 for simultaneous heating of the sheets of glass 34, 36. Since condensation will form more frequently on the exposed surface 74 of the outermost glass 36, it may be preferable to use a separate switch 92 for each sheet of glass 34, 36. FIG. 3 shows the two sensors 28 positioned between the sheets of glass 34, 36. FIG. 8 shows the microprocessor 112 for processing multiple sensors 28 and two switches 92 for independently controlling power to the conductive coating 38 on the sheets of glass 34, 36.

One of the benefits of the insulating glass unit 26 of the present invention is improved insulating value. The lower the hemispheric emissivity of the coated glass 36, the better the insulating value (R value) of the insulating glass unit 30. The preferred hemispheric emissivity is below 0.50. The pyrolytic low emissivity glass, which is suitable for on-line production, can achieve hemispheric emissivity in the range of 0.10 to 0.20. Pyrolytic low emissivity glass is preferred because of the low cost of production. Other low emissivity glass, such as sputter-coated multilayered glass, can be used to achieve hemispheric emissivity below 0.10. Any low emissivity glass can be used in the insulating glass unit 30 of the present invention. Because of the lower emissivity and the resulting improvement in the insulating capabilities, a two-paned insulating glass unit 26 can achieve comparable insulating values for a triple-paned door without low emissivity glass. A double-paned door with low emissivity glass can achieve R values of 4.0. The improved R value will keep the outermost glass up to five degrees warmer than the uncoated triple-paned units, which further reduces the need for applying heat to the glass. The two-paned door of the present invention will typically provide significant cost and weight savings when compared to a triple-paned door in freezer door applications.

When low emissivity glass directly connected to a power source, the sheet resistance is unacceptably low. This low resistance results in a current level and heat dissipation in the coated surface 38 which is too high for continuous direct power connection for freezer or refrigerator door applications. By adding sensors 28 and a controller 30 to the system, the low emissivity glass 34, 36 can be selectively heated only when condensation has formed on the glass 34, 36. Since power is not continuously applied to the glass 34, 36, the overall power dissipation is acceptable for insulating glass units 26 used as freezer or refrigerator doors.

The heated glass system 10 and the insulating glass unit 26 of the present invention permits the use of low emissivity glass, including pyrolytic low emissivity glass. The use of such glass provides a number of advantages, including low cost, improved thermal performance, improved coating uniformity, and good product appearance. Using an optical sensor to detect the optical condition of condensation on the surface of the glass provides an accurate device for controlling the heating of the glass to eliminate the condensation. In an insulating glass unit, the sensors are conveniently mounted in the space between the sheets of glass. This mounting configuration is desirable from a space standpoint and provides excellent protection of the sensors from adverse environmental factors, such as moisture and dust. Control circuitry, including a microprocessor can be conveniently mounted on a circuit board in the frame of the insulating glass unit.

Since the present invention does not require continuous heating of the glass by direct connection to the power source, the resistance of the coating does not have to be changed for each different door design. The same coated glass can be used on all of the door designs by a manufacturer of insulating glass units. The capability of directly sensing condensation on the glass and operating only when condensation is detected facilitates the operation of the door under dry, normal, and humid conditions.

In accordance with the provisions of the patent statutes, the present invention has been described in what is considered to represent its preferred embodiment. However, it should be noted that the invention can be practiced otherwise than as specifically illustrated and described without departing from its spirit or scope.

What is claimed is:

1. A refrigerated cabinet door adapted to be mounted on a refrigerated cabinet, said door comprising:

a first sheet of glass adapted to be positioned adjacent the ambient environment of the refrigerated cabinet and a second sheet of glass adapted to be positioned adjacent the interior of the refrigerated cabinet, each sheet of glass having an unexposed surface and an outer surface;

a conductive coating applied to the unexposed surface of said first sheet of glass, said conductive coating having a hemispheric emissivity of less than 0.50;

a frame secured around a periphery of said first and second sheets of glass for maintaining the glass sheets in parallel, spaced-apart relationship with the unexposed surfaces facing each other and creating a space therebetween;

a pair of bus bars mounted along opposite edges on the unexposed surface of said first sheet of glass and electrically connected to said conductive coating, said bus bars each including a connector for connecting said bus bar to a power supply to form a circuit through said conductive coating;

at least one optical sensor, mounted on the unexposed surface of said first sheet of glass and positioned in the space between said first and second sheets of glass, for directly sensing the presence of moisture on the outer surface of said first sheet of glass and generating a control signal in response thereto; and a control circuit electrically connected to said bus bars and said optical sensor for selectively transmitting current through said conductive coating in response to the control signal from said optical sensor.

2. The refrigerated cabinet door defined in claim 1, wherein the sheet resistance of said conductive coating is less than 20 ohms per square.

3. The refrigerated cabinet door defined in claim 1, wherein said conductive coating has a hemispheric emissivity in the range from 0.15 to 0.43.

4. The refrigerated cabinet door defined in claim 1, wherein said conductive coating is a pyrolytic coating.

5. The refrigerated cabinet door defined in claim 1, wherein a transparent insulating gas is provided in the space between said first and second sheets of glass.

6. The refrigerated cabinet door defined in claim 1, including a plurality of optical sensors mounted on the unexposed surface of said first sheet of glass and positioned in the space between said first and second sheets of glass, and being electrically connected to said control circuit.

7. The refrigerated cabinet door defined in claim 1, wherein said control circuit is mounted on a circuit board and the circuit board is positioned in said frame.

8. The refrigerated cabinet door defined in claim 1, wherein said control circuit transmits power for a period of time in response to a control signal indicating moisture has formed on the outer surface of said first sheet of glass.

9. The refrigerated cabinet door defined in claim 8, wherein said control circuit transmits power for a first period of time at full power and a second period of time at a reduced power in response to a control signal indicating moisture has formed on the outer surface of said first sheet of glass.

* * * * *